United States Patent
Degors et al.

(10) Patent No.: US 9,673,221 B2
(45) Date of Patent: Jun. 6, 2017

(54) SEMICONDUCTOR DEVICE WITH LOW BAND-TO-BAND TUNNELING

(71) Applicant: International Business Machines Corporation, Armonk, NY (US)

(72) Inventors: Nicolas Degors, Le Versoud (FR); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/636,523

(22) Filed: Mar. 3, 2015

(65) Prior Publication Data

US 2016/0260740 A1 Sep. 8, 2016

(51) Int. Cl.
| | |
|---|---|
| *H01L 27/12* | (2006.01) |
| *H01L 29/06* | (2006.01) |
| *H01L 29/165* | (2006.01) |
| *H01L 29/78* | (2006.01) |
| *H01L 29/10* | (2006.01) |
| *H01L 21/762* | (2006.01) |
| *H01L 27/092* | (2006.01) |
| *H01L 21/84* | (2006.01) |
| *H01L 21/8234* | (2006.01) |
| *H01L 21/8238* | (2006.01) |

(52) U.S. Cl.
CPC ...... *H01L 27/1211* (2013.01); *H01L 21/7624* (2013.01); *H01L 21/84* (2013.01); *H01L 27/1203* (2013.01); *H01L 29/0653* (2013.01); *H01L 29/1054* (2013.01); *H01L 29/165* (2013.01); *H01L 29/785* (2013.01); *H01L 21/823412* (2013.01); *H01L 21/823807* (2013.01); *H01L 21/845* (2013.01); *H01L 27/0922* (2013.01); *H01L 2029/7858* (2013.01)

(58) Field of Classification Search
CPC ............ H01L 27/1211; H01L 29/0653; H01L 29/165; H01L 29/785; H01L 29/1054; H01L 21/7624; H01L 21/84; H01L 27/1203
See application file for complete search history.

(56) References Cited

U.S. PATENT DOCUMENTS

| | | |
|---|---|---|
| 6,004,134 A | 12/1999 | Crabbe et al. |
| 6,744,083 B2 | 6/2004 | Chen et al. |

(Continued)

FOREIGN PATENT DOCUMENTS

DE 102016103402 A1 9/2016

OTHER PUBLICATIONS

Bal et al., "A laterally graded junctionless transistor," 2014, pp. 034003-1-034003-4, Journal of Semiconductors, vol. 35, No. 3.

(Continued)

*Primary Examiner* — Long Pham
(74) *Attorney, Agent, or Firm* — Steven J. Meyers; Hoffman Warnick LLC

(57) ABSTRACT

The invention includes a semiconductor device comprising an interlevel dielectric layer over a buried insulator layer over a semiconductor substrate; a source and drain in the interlevel layer; a channel between the source and drain, the channel including a first region having a first bandgap adjacent to a second region having a second bandgap, wherein the first band gap is larger than the second bandgap; and a gate over the channel.

19 Claims, 7 Drawing Sheets

(56) References Cited

U.S. PATENT DOCUMENTS

| | | |
|---|---|---|
| 7,442,585 B2 | 10/2008 | Zhu et al. |
| 7,755,137 B2 | 7/2010 | Dolny et al. |
| 7,808,040 B2 | 10/2010 | Foerster |
| 8,294,222 B2 | 10/2012 | Anderson et al. |
| 8,455,858 B2 | 6/2013 | Wang et al. |
| 8,501,601 B2 | 8/2013 | Flachowsky et al. |
| 2007/0063261 A1* | 3/2007 | Chen ................. H01L 29/665 257/316 |
| 2011/0309334 A1 | 12/2011 | Chang et al. |
| 2016/0149001 A1* | 5/2016 | Oxland ............... H01L 29/1041 257/24 |

OTHER PUBLICATIONS

Solomon et al., "Tunnel Current Measurements on P/N Junction Diodes and Implications for Future Device Design," 2003, pp. 9.3.1-9.3.4, IEEE.

\* cited by examiner

US 9,673,221 B2

SEMICONDUCTOR DEVICE WITH LOW BAND-TO-BAND TUNNELING

BACKGROUND

The present invention relates to semiconductor devices. More particularly, the invention relates to semiconductor devices having low band-to-band tunneling.

Band-to-band (BTB) tunneling describes the effect of electrons traveling from the valence band through a bandgap to the conduction band of a semiconductor device. As semiconductor devices get smaller, BTB tunneling increases due to higher doping levels, and more recently, through the use of narrow-bandgap materials Conventional metal-oxide-semiconductor field-effect transistors (MOSFETs) include a channel region between a source and a drain that is pure silicon. This mitigates BTB tunneling because silicon has a relatively wide bandgap, but may also limit semiconductor performance. To increase the performance of a product, some conventional devices employ a channel region of strained silicon-germanium between the source and drain. However, this approach may increase the total amount of BTB tunneling in the integrated circuit due to the narrower bandgap of silicon-germanium, especially under compressive strain. The BTB tunneling is particularly egregious for high-voltage devices such as, for example, 1.8V devices for IO applications, which have a channel length much longer than the minimum lithographic capability.

SUMMARY

A first aspect of the invention includes a semiconductor device comprising an interlevel dielectric layer on a buried insulator layer over a semiconductor substrate; a source and drain in the interlevel dielectric layer; a channel between the source and drain, the channel including a first region having a first bandgap adjacent to a second region having a second bandgap, wherein the first band gap is larger than the second bandgap; and a gate over the channel.

A second aspect of the invention includes a semiconductor device with a bifurcated bandgap. The semiconductor device comprises a plurality of semiconductor structures including at least one long channel semiconductor structure and at least one short channel semiconductor structure. The at least one long channel semiconductor structure includes a first source and a first drain in an interlevel dielectric layer, a long channel region between the first source and the first drain. The long channel region includes a first region having a first bandgap and a second region having a second bandgap, wherein the first region is larger than the second band gap, and a first gate on the long channel region. The at least one short channel semiconductor structure includes a second source and a second drain in the interlevel dielectric layer, a short channel region between the second source and the second drain; wherein the first bandgap and the second bandgap bifurcate the bandgap of the semiconductor device.

A third aspect of the invention includes a method of fabricating a semiconductor device. The method comprises forming a buried insulator layer over a substrate; depositing a first semiconductor layer having a first bandgap on the buried insulator layer; depositing a hardmask on the first semiconductor layer to define at least one long channel region and at least one short channel region such that the at least one long channel region is adjacent to the at least one short channel region; epitaxially depositing a second semiconductor layer having a second bandgap over the first semiconductor layer in the at least one long channel region and the at least one short channel region, the first bandgap being larger than the second bandgap; combining the first and second layers to create a third semiconductor layer; removing the hardmask to expose the first semiconductor layer remaining under the hardmask; removing a portion of the remaining first semiconductor layer between the at least one long channel region and the at least one short channel region to substantially separate the at least one long channel region and the at least one short channel region; and forming a gate on each of the at least one long channel regions and the at least one short channel regions.

BRIEF DESCRIPTION OF THE DRAWINGS

These and other features of the present invention will be more readily understood from the following detailed description of the various aspects of the invention taken in conjunction with the accompanying drawings that depict various embodiments of the invention, in which.

DETAILED DESCRIPTION OF THE DRAWINGS

Embodiments of the present invention include a high performance semiconductor device with at least two regions including different bandgaps, which can reduce band-to-band (BTB) tunneling while retaining much of the benefit of performance associated with narrow-bandgap materials. A semiconductor device according to embodiments of the present disclosure can include a channel between a source and a drain of the semiconductor device and a gate over the channel. Devices according to the present disclosure can decrease BTB tunneling by providing a first region of one material having a larger (i.e., wider) bandgap adjacent to the source and/or drain, and a second region of another material having a smaller (i.e., narrower) bandgap in the center of the channel to maintain high performance of the semiconductor device. That is, a majority of the channel will benefit from strain-induced transport improvement in the second region of the channel while BTB tunneling will be reduced due to the first region of the channel having a material with a larger bandgap.

Figure 1:
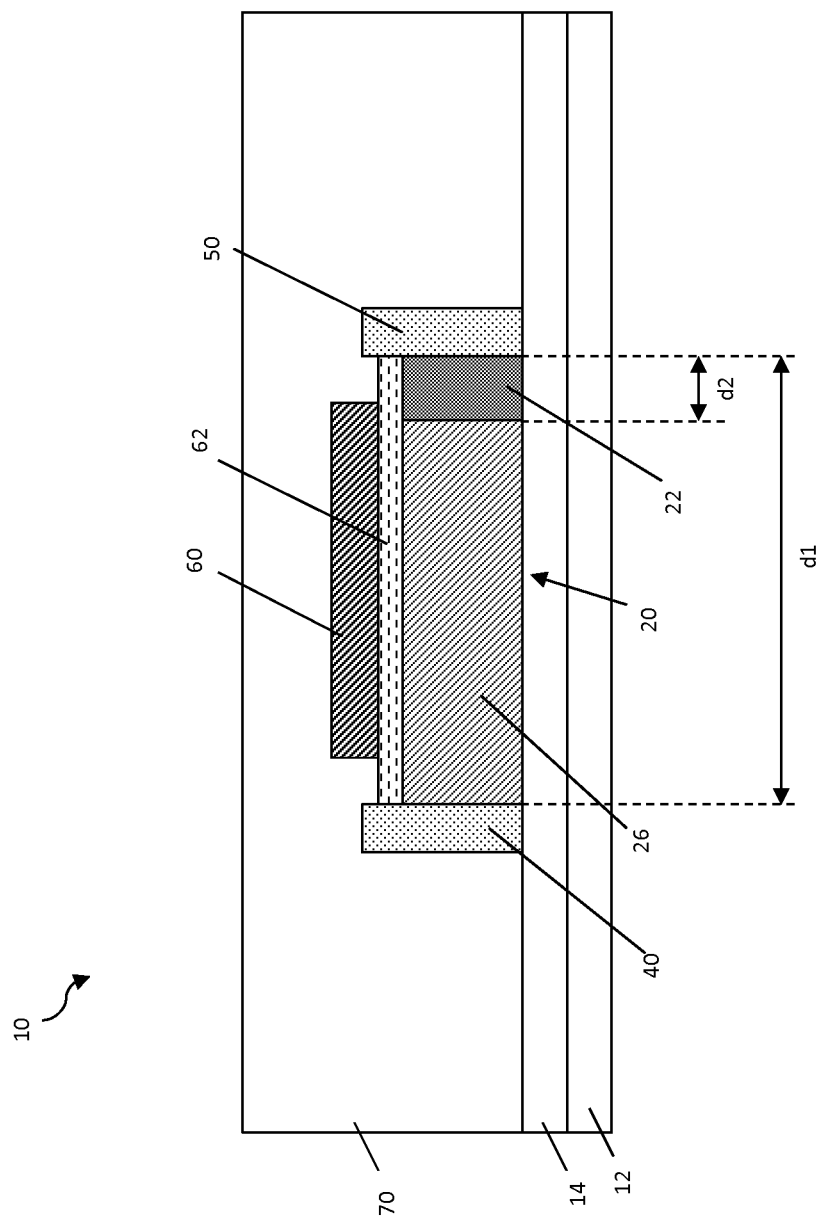
FIGS. 1-6 show cross-sections of various embodiments of the semiconductor device.

The semiconductor devices described herein may be MOSFETs, or more specifically, fully depleted silicon on insulator devices (FDSOIs) or FinFETs as are generally known in the art of semiconductor manufacturing. Referring now to FIG. 1 which shows a cross-section of an embodiment of the invention, semiconductor device 10 may include a substrate 12, a buried insulator layer 14, a channel 20, a source 40, a drain 50, a gate 60, and an interlevel dielectric layer 70. The material composition of substrate 12 may include without limitation: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Buried insulator layer 14 may be disposed on substrate 12. Buried insulator layer 14 may include a buried oxide (BOX) layer, a nitride, an oxynitride, or other suitable insulating material(s). In one embodiment, buried insulator layer 14 may include an oxide, such as silicon oxide ($SiO_2$), hafnium oxide ($HfO_2$), zirconium oxide ($ZrO_2$), aluminum oxide ($Al_2O_3$), titanium oxide ($TiO_2$), lanthanum oxide ($La_2O_3$), strontium titanate ($SrTiO_3$), lanthanum aluminate ($LaAlO_3$), and combinations thereof.

Source 40 and drain 50 may be disposed on buried insulator layer 14. Source 40 and drain 50 may be formed of any currently known or later developed semiconductor material(s) or combinations thereof, including, but not limited to: silicon (Si), silicon carbon (SiC), silicon germanium (SiGe), silicon germanium carbon (SiGeC), Ge alloys, gallium arsenic (GaAs), indium arsenic (InAs), indium phosphorus (InP), other iii-V or ii-VI compound semiconductors, as well as organic semiconductors. Source 40 and drain 50 may comprise a single semiconductor layer, or a multiplicity of semiconductor layers.

Figure 2:
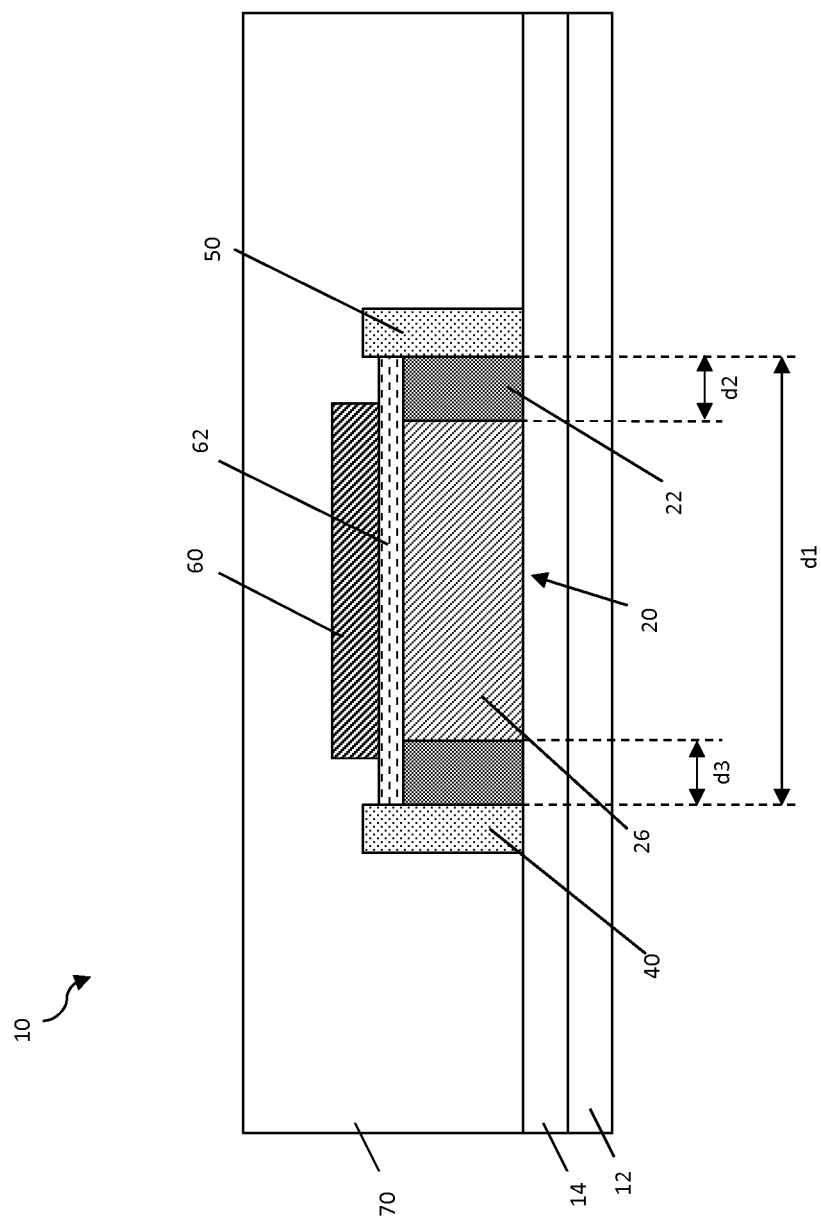

Channel 20 may be disposed on buried insulator layer 14 such that channel 20 is positioned between source 40 and drain 50. However, it is to be understood that channel 20 may be disposed directly on substrate 12 without departing from embodiments of the invention. Channel 20 may have a length d1 of approximately 70-150 nanometers (nm) or more (FIGS. 1 and 2). It is to be understood that source 40 and drain 50 are not limited to their respective positions as shown in FIGS. 1-6, but rather, source 40 and drain 50 may be positioned proximate to either side of channel 20 such that source 40 and drain 50 are substantially (physically) separated by channel 20. That is, in another embodiment (not shown), source 40 may be positioned where drain 50 is positioned in FIGS. 1-6 and drain 50 may be positioned where source 40 is positioned in FIGS. 1-6. Channel 20 may include at least two different materials selected from a group consisting of silicon (Si), germanium (Ge), carbon (C), gallium (Ga), arsenic (As), indium (In), aluminum (Al), antimony (Sb), boron (B), lead (Pb), and combinations thereof. Channel 20 may include a first region 22 and a second region 26. First region 22 may include a material having a first bandgap and second region 26 may include another material having a second bandgap. The first bandgap of the material in first region 22 may be larger than the second bandgap of the material in second region 26. As an example, the larger bandgap may be 1.0 eV to 1.5 eV, while the smaller bandgap may be 0.6 eV to 1.0 eV. However, it is to be understood that the larger bandgap may exceed 1.5 eV, and the smaller bandgap may be less than 0.6 eV without departing from embodiments of the invention. For example, first region 22 may include Si and second region 26 may include strained SiGe. In another example, first region 22 may include Ga and second region 26 may include Ga in InAs.

In one embodiment, as shown in FIG. 1, first region 22 may be adjacent to drain 50 and second region 26 may be adjacent to source 40. First region 22 substantially (physically) separates second region 26 from drain 50. Band tunneling may be calculated by conventional means, for example, by using the Wentzel-Kramers-Brillouin (WKB) approximation known in the art of quantum tunneling calculations. A distance of band tunneling as used herein, generally refers to a distance of electrons traveling from the valence band through a bandgap to the conduction band of a semiconductor device, or a length d2 of dimension of first region 22. Here, first region 22 may have a length d2 (i.e., extend from drain 50 a distance) that is substantially equal to a distance of band tunneling of drain 50. That is, length d2 of first region 22 may depend on the band tunneling of drain 50. First region 22 may represent approximately 5-10% of length d1 of channel 20. Second region 26 may represent approximately 90-95% of length d1 of channel 20. In an example, channel 20 can be approximately 140 nm long. In this example, second region 26 may be approximately 130 nm long and first region 22 may be 10 nm long.

As shown in FIG. 2, in an alternative embodiment, semiconductor device 10 can include a first subregion 22a and a second subregion 22b. This embodiment may be used where it is not known which end of channel 20 that drain 50 is positioned. That is, first subregion 22a may be positioned adjacent to source 40 and second subregion 22b may be adjacent to drain 50. Second subregion 26 can separate first and second subregion 22a, 22b from each other. First subregion 22a may have a length d3 that is substantially equal to a distance of band tunneling of source 40 when that terminal (source 40) operates as a drain. Second subregion 22b may have a length d2 that is substantially equal to a distance of band tunneling of drain 50. First and second subregions 22a, 22b may together represent approximately 5-10% of the length d1 of channel 20. Second region 26 may represent approximately 90-95% of length d1 of channel 20. In one example, channel 20 can be approximately 140 nm long. In this example, second region 26 may be 120 nm long and first and second subregions 22a, 22b may each be 10 nm long. In another example, in which device 10 is not entirely symmetric, the first subregion 22a may be 5 nm long and second subregion 22b may be 10 nm long.

Referring now to both FIGS. 1 and 2, gate 60 may be disposed on channel 20 such that gate 60 is over first region 22 and second region 26 as shown in FIG. 1, or over first subregion 22a, second subregion 22b, and second region 26 as shown in FIG. 2. Gate 60 may include a polycrystalline silicon ("polysilicon") electrode and set of spacers where desired and/or applicable. However, these elements are omitted from FIGS. 1-2 for clarity. Additionally, semiconductor device 10 may include an insulator layer 62 between gate 60 and channel 20. Insulator layer 62 may include one or more dielectric materials including but not limited to: silicon nitride ($Si_3N_4$), silicon oxide ($SiO_2$), hafnium oxide ($HfO_2$), aluminum oxide ($AlO_2$), nitride, fluorinated oxide, nitrated oxide, other high dielectric constant (>3.9) material, or multiple layers thereof.

Interlevel dielectric layer 70 may be formed on buried insulator layer 14 such that channel 20, source 40, drain 50, and gate 60 are substantially surrounded by interlevel dielectric layer 70. Interlevel dielectric layer 70 may include one or more dielectric materials including but not limited to: silicon nitride ($Si_3N_4$), silicon oxide ($SiO_2$), fluorinated SiO2 (FSG), hydrogenated silicon oxycarbide (SiCOH), porous SiCOH, boro-phoso-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or multiple layers thereof. It is to be understood that interlevel dielectric layer 70 as described herein may include contacts (not shown) as known in the art of semiconductor manufacturing.

While embodiments of the invention have been described with reference to a FDSOI device, it is to be understood that embodiments of the invention may also apply to other semiconductor devices such as a FinFET which would operate under much of the same principles as the FDSOI device described herein but may include a single gate structure and multiple fins. Where semiconductor device 10 is a FinFET, channel 20 may be formed of semiconductor fin (not shown), a portion of which is substantially surrounded by gate 60 as is well known in the art of semiconductor manufacturing. A FDSOI device may have a height of, e.g., between approximately 4-10 nm and a length of 70-150 nm or more. A FinFET may have a height of between approximately 25-50 nm and a length of 70-150 nm or more. That is, a cross-section of a FinFET device may look substantially similar to a cross-section of the FDSOI device except the channel region of the FDSOI device is relatively shorter in height and larger in depth.

Figure 3:
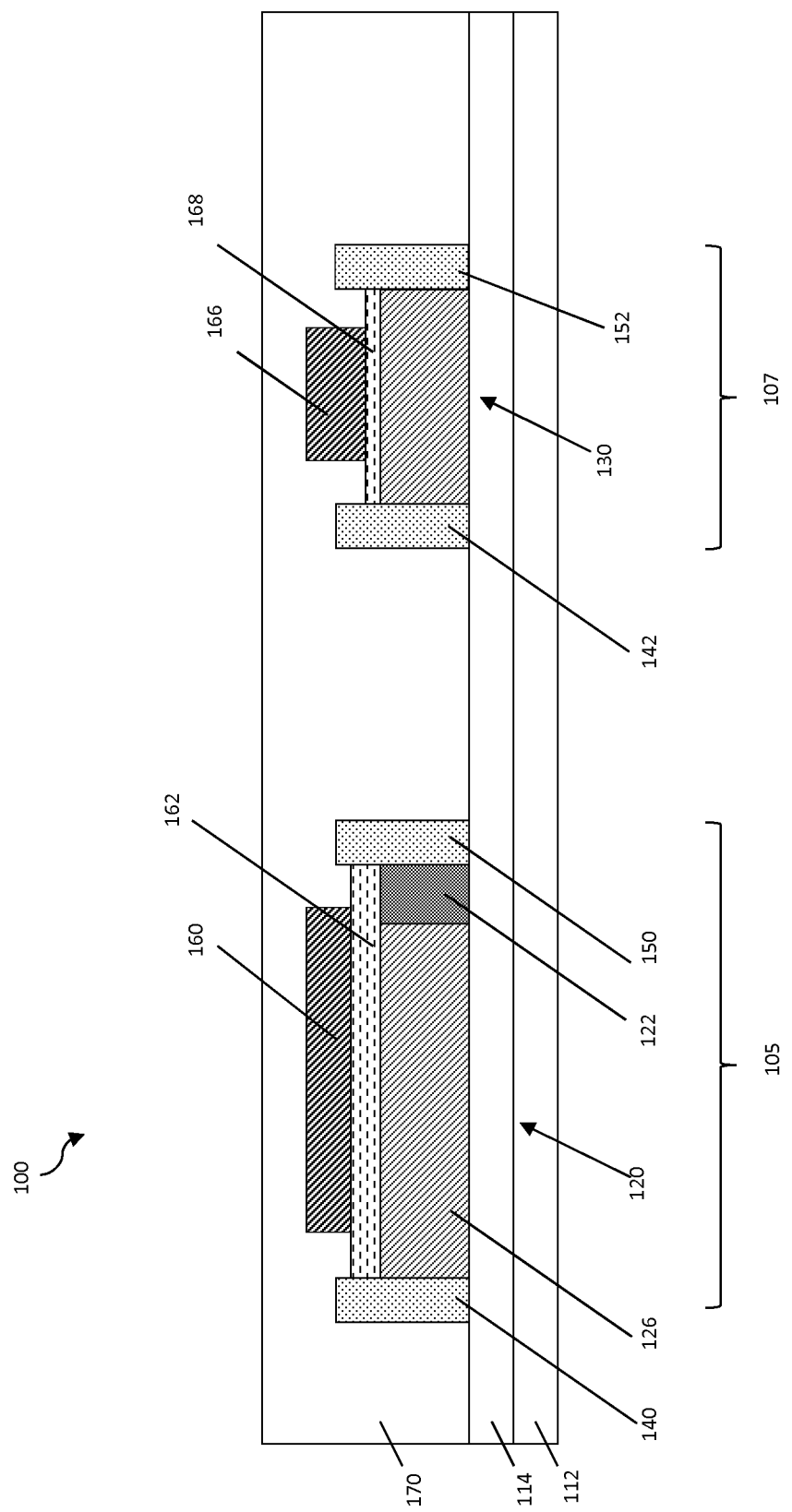
Figure 4:
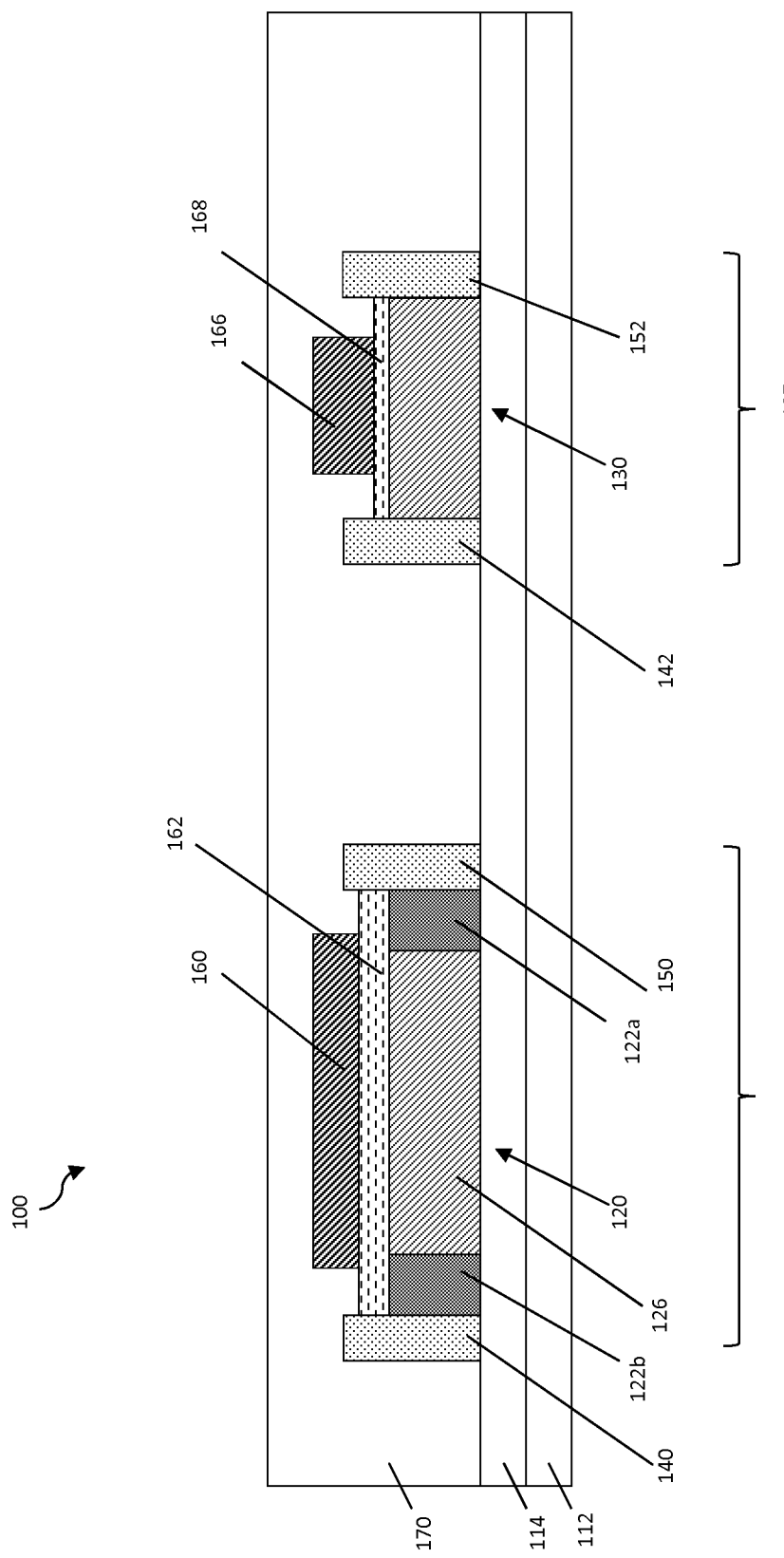

FIGS. 3 and 4 show another embodiment of the invention. In this embodiment, semiconductor device 100 may have at least one long channel semiconductor structure 120 and at least one short channel semiconductor structure 130. While only a single long channel semiconductor structure and a single short channel semiconductor structure are shown, it is to be understood that semiconductor device 100 may include multiple short and long channel semiconductor structures, which are not shown in FIGS. 3 and 4 for clarity. Short channel semiconductor devices may be used for lower voltage operations. For those devices it may be impractical to provide for two separate portions of the channel region, when the channel length may be not very much larger (15-25 nm) than the typical tunneling distance of a drain (10 nm). That is, embodiments of the present invention provide for a semiconductor device wherein both dual-material channel devices (for example, long channel semiconductor structure 120) and single-material devices (for example, short channel semiconductor structure 130) may coexist.

FIG. 3 shows an embodiment of semiconductor device 100. In this embodiment, buried insulator layer 114 is disposed on substrate 112. Long channel semiconductor structure 105 and short channel semiconductor structure 107 are disposed on buried insulator layer 114. Long channel semiconductor structure 105 may include a first source 140 and a first drain 150 substantially separated by a long channel region 120. First source 140 and first drain 150 may be composed of any of the example materials discussed herein with respect to source 40 (FIGS. 1, 2) and drain 50 (FIGS. 1, 2). Long channel region 120 may have a length of approximately 70-150 nm. Long channel region 120 may include a first region 122 and a second region 126. First region 122 may include a material having a first bandgap. Second region 126 may include another material having a second bandgap such that the first bandgap is larger than the second bandgap. Long channel region 120 may be composed of any of the example materials discussed herein with respect to channel 20 (FIGS. 1-2). For example, first region 122 may include Si and second region 126 may include strained SiGe. In another example, first region 122 may include Ga and second region 126 may include Ga in InAs. First region 122 may be adjacent to first drain 150 and second region 126 may be adjacent to first source 140. In this embodiment, first region 122 may have a length (i.e., extend from drain 150 a distance) that is substantially equal to a distance of band tunneling of first drain 150 as described herein. That is, a length of first region 122 may depend on the band tunneling of first drain 150. As shown in FIG. 3, first region 122 substantially separates second region 126 from first drain 150.

Turning to FIG. 4, embodiments of semiconductor device 100 can include a first subregion 122a and a second subregion 122b. First subregion 122a may be adjacent to first source 140 and second subregion 122b may be adjacent to first drain 150. First subregion 122a may have a length (i.e., extend from first source 140 a distance) that is substantially equal to a distance of band tunneling of source 140 when that terminal (source 140) operates as drain. Second subregion may have a length (i.e., extend from first drain 150 a distance) that is substantially equal to a distance of band tunneling of drain 150. In this embodiment, second subregion 126 substantially separates first and second subregion 122a, 122b from each other.

Referring to FIGS. 3 and 4 together, short channel semiconductor structure 107 may also be disposed on buried insulator layer 114. Short channel semiconductor structure 107 may be substantially (physically) separated from long channel semiconductor structure 105. Short channel semiconductor structure 107 may include a short channel region 130, a source 142, and a drain 152 on buried insulator layer 114. Short channel region 130 may have a length of 10-50 nm. Short channel region 132 may include the same material as second region 126 of long channel semiconductor structure 105. Short channel region 130 can have a bandgap which is substantially equal to the bandgap of second region 126 of long channel semiconductor structure 105 or may in principle be of yet another material having another bandgap. Short channel region 130 can separate second source 142 and second drain 152.

Long and short channel semiconductor structures 105, 107 may each include first and second gates 160, 166 respectively. First gate 160 may be disposed on long channel semiconductor structure 105 such that first gate 160 is over first region 122 and second region 126 as shown in FIG. 3 or over first subregion 122a, second subregion 122b, and second region 126 as shown in FIG. 4. First gate 160 may include a poly-silicon electrode and set of spacers, but these elements are omitted from FIGS. 3-4 for clarity. Additionally, semiconductor device 100 may include a first insulator layer 162 positioned between first gate 160 and long channel semiconductor structure 105.

Second gate 166 may be disposed on short channel semiconductor structure 107 such that second gate 166 is over short channel region 132 as shown in FIGS. 3 and 4. Second gate 166 may include a poly-silicon electrode and set of spacers, but these elements are not shown in FIGS. 3-4 for clarity. Additionally, semiconductor device 100 may include a second insulator layer 168 between gate 166 and short channel semiconductor structure 107. Insulator layers 162, 168 may include any of the materials discussed previously with reference to insulator layers of FIGS. 1 and 2. First insulator layer 162 may have a greater thickness than a thickness of second insulator layer 168. First insulator layer 162 may have a thickness of 2.0-7.0 nm. However, for higher voltage applications, first insulator layer 162 may have a thickness that exceeds 7.0 nm. Second insulator layer 168 may have a thickness of 0.6 to 1.2 nm. Additionally, an interlevel dielectric layer 170 may be formed on buried insulator layer 114 such that long channel semiconductor structure 105 and short channel semiconductor structure 107 are within interlevel dielectric layer 170. Interlevel dielectric layer 170 may include any of the materials discussed herein relative to interlevel dielectric layer 70 of FIGS. 1 and 2. It is to be understood that interlevel dielectric layer 170 as described herein may include contacts (not shown) as known in the art of semiconductor manufacturing.

As discussed previously, embodiments of the invention may apply to a Fin-FET device. Where semiconductor device 100 is a FinFET, long channel region 120 may be in the form of a semiconductor fin (not shown) that is substantially surrounded by gate 160. Short channel region 130 may be in the form of a semiconductor fin (not shown), a portion of which can be substantially surrounded by gate 166.

Figure 5:
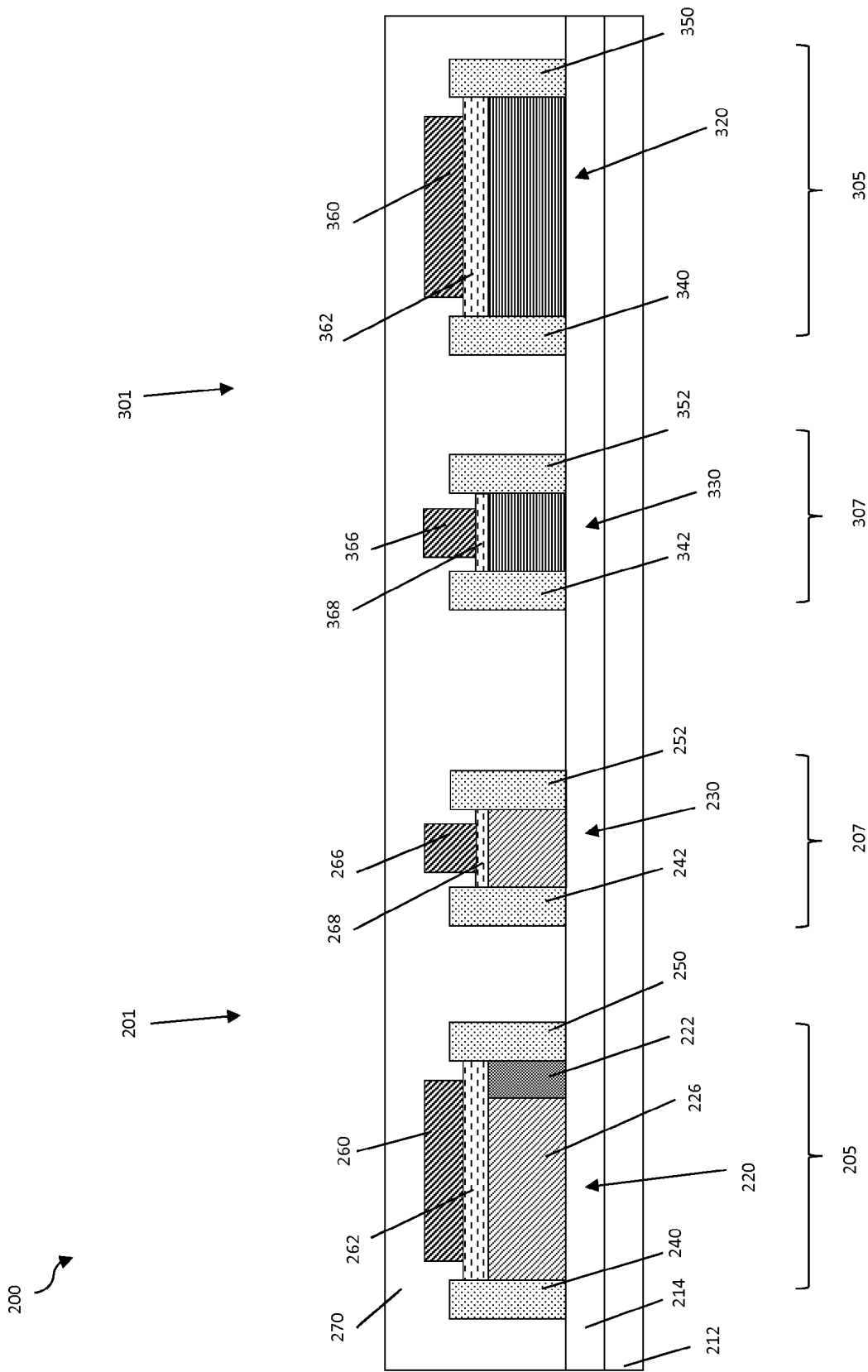
Figure 6:
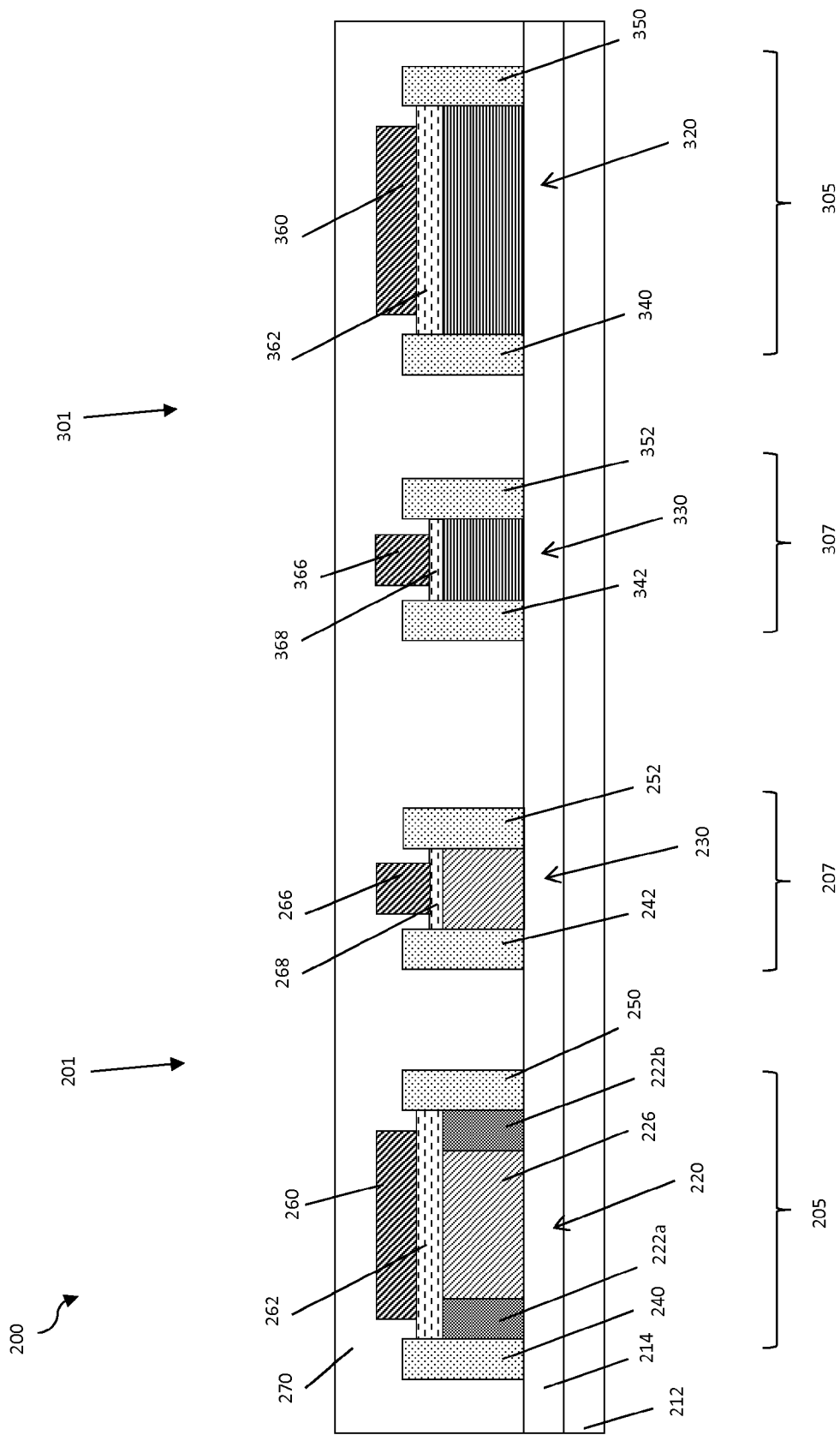

Semiconductor devices fabricated according to embodiments of the invention may also contain transistors having entirely different channel material, herein described as a p-type field effect transistor (PFET) and an n-type field effect transistor (NFET). FIGS. 5 and 6 show another embodiment of the invention, where a semiconductor device 200 can include a PFET 201 adjacent to a NFET 301. In this embodiment, PFET 201 may include a first long channel semiconductor structure 205 and a first short channel semiconductor structure 207 and NFET 301 may include a second long channel semiconductor structure 305 and a second short channel semiconductor structure 307.

First long channel semiconductor structure 205 and first short channel semiconductor structure 207 of PFET 201 may be disposed on a buried insulator layer 214 over a substrate 212. Second long channel semiconductor structure 305 and second short channel semiconductor structure 307 of NFET 301 may also be disposed on buried insulator layer 214 over substrate 212. The materials of buried insulator layer 214 and substrate 212 may include the same materials discussed with reference to buried insulator layers 14 (FIGS. 1 and 2), 114 (FIGS. 3 and 4).

Referring to FIG. 5, first long channel semiconductor structure 205 can include a first source 240 and a first drain 250 substantially separated by a long channel region 220. First source 240 and first drain 250 may be composed of any of the materials discussed relative to the previous embodiments. First long channel region 220 may have a length of approximately 70-150 nm. First long channel region 220 may be any of the materials also used in the composition of channel region 20 (FIGS. 1, 2) and long channel region 120 (FIGS. 3, 4). As discussed previously herein, first long channel region 220 may include a first region 222 and a second region 226. First region 222 may include a material having a first bandgap. Second region 226 may include another material having a second bandgap such that the first bandgap is larger than the second bandgap. First region 222 may be adjacent to first drain 250 and second region 226 may be adjacent to first source 240. Here, first region 222 may have a length (i.e., extend from first drain 250 a distance) that is substantially equal to a distance of band tunneling of first drain 250. That is, a thickness of first region 222 may depend on the band tunneling of first drain 250. As shown in FIG. 5, first region 222 substantially separates second region 226 from first drain 250.

In another embodiment, as shown in FIG. 6, semiconductor device 200 can include a first subregion 222a and a second subregion 222b as described with respect to first and second subregions 122a, 122b (FIGS. 3, 4). First subregion 222a may be adjacent to first source 240. Second subregion 222b may be adjacent to first drain 250. First subregion 222a may have a length (i.e., extend away from first source 240 a distance) that is substantially equal to a distance of band tunneling of first source 240. Second subregion may have a length (i.e., extend away from first drain 250 a distance) that is substantially equal to a distance of band tunneling of first drain. In this embodiment, second subregion 226 substantially separates first and second subregion 222a, 222b from each other.

Referring now to FIGS. 5 and 6 together, first short channel semiconductor structure 207 can include a first short channel region 230 composed of a material having a smaller bandgap than the material composition of first region 222 of long channel semiconductor structure 220. That is, the material used for first short channel region 230 of first short channel semiconductor structure 207 may be the same material used for second region 226 of first long channel semiconductor structure 205. In an alternative embodiment, first short channel semiconductor structure 207 may include a material different second region 226. Short channel region 130 may have a length of 15-25 nm. First short channel semiconductor structure 207 may also include a second source 242 and a second drain 252. Second source 242 and second drain 252 may be substantially separated by first short channel region 230.

Second long channel semiconductor structure 305 may include a third source 340 and a third drain 350 substantially separated by a second long channel region 320. Third source 340 and third drain 350 may include any of the materials for sources and drains discussed relative to the previous embodiments. Second long channel region 320 may have a length of approximately 70-150 nm. Second long channel region 320 may be any of the materials also used in the composition of channel region 20 (FIGS. 1, 2) and long channel region 120 (FIGS. 3, 4). Second short channel semiconductor structure 307 may include a fourth source 342 and a fourth drain 352 substantially separated by a second short channel region 330. Second short channel region 330 may have a length of 15-25 nm. Fourth source 342 and fourth drain 352 may include any of the materials for sources and drains discussed relative to the previous embodiments. Second short channel region 330 may include any of the materials for channel regions previously discussed relative to other embodiments.

Second long channel region 320 of second long channel semiconductor structure 305 and short channel region 330 of second short channel semiconductor structure 307 may include a material with a larger bandgap than the material of first region 222 of first long channel semiconductor structure 205. That is, the material used for regions 320 and 330 may be the same material used for first region 222 of first long channel semiconductor structure 205. Alternatively, the material used for regions 320 and 330 may be different from the material used for first region 222. However, while FIGS. 5 and 6 show only first long channel region 220 of PFET 201 as having a bifurcated bandgap, it is to be understood that in another embodiment second long channel semiconductor structure 305 of NFET 301 may also include a second long channel region 320 with a bifurcated bandgap. Alternatively, NFET 301 may include a second long channel region 320 with a bifurcated bandgap in place of first long channel semiconductor structure 205 of PFET 201.

As discussed herein, each semiconductor structure 205, 207, 305, 307 may also include a gate 260, 266, 360, 366 respectively. A first gate 260 may be disposed on first long channel region 220 such that gate 260 is over first region 222 and second region 226 as shown in FIG. 5. Alternatively, first gate 260 can be positioned over first subregion 222a, second subregion 222b, and second region 226 as shown in FIG. 6. First gate 260 may include a poly-silicon electrode and set of spacers, which are omitted from FIGS. 5-6 for clarity. Additionally, first long channel semiconductor structure 205 may include a first insulator layer 262 between first gate 260 and first long channel region 220.

A second gate 266 may be disposed on first short channel semiconductor structure 207 such that gate 266 is over first short channel region 230 as shown in FIGS. 5 and 6. Second gate 266 may include a poly-silicon electrode and set of spacers, which are omitted from FIGS. 5-6 for clarity. Additionally, first short channel semiconductor structure 207 may include a second insulator layer 268 between second gate 266 and first short channel region 230. Second insulator layer 268 may have a lower value of thickness than first insulator layer 262.

A third gate 360 may be disposed on second long channel region 320. Third gate 360 may include a poly-silicon electrode and set of spacers as is well known in the art but not shown in FIGS. 5-6 for clarity. Additionally, second long channel semiconductor structure 305 may include a third insulator layer 362 between third gate 360 and second long channel region 320. A fourth gate 366 may be disposed on second short channel region 330. Fourth gate 366 may include a poly-silicon electrode and set of spacers as is well known in the art but not shown in FIGS. 5-6 for clarity. Additionally, second short channel semiconductor structure 307 may include a fourth insulator layer 368 between fourth gate 366 and second short channel region 330. Fourth insulator layer 368 may be thinner than third insulator layer 362. In one embodiment, fourth insulator layer 368 may have a thickness substantially equal to second insulator layer 268 and third insulator layer 362 may have a thickness substantially equal to first insulator layer 262. In another embodiment, insulator layers 262, 268, 362, 368 may be of varying thicknesses.

Insulator layers 262, 268, 362, 368 may include any of the materials discussed previously with reference to insulator layers of FIGS. 1 and 2. Additionally, an interlevel dielectric layer 270 may be formed on buried insulator layer 214 such that semiconductor structures 205, 207 of PFET 201 and semiconductor structures 305, 307 of NFET 301 are substantially surrounded by interlevel dielectric layer 270. It is to be understood that interlevel dielectric layer 270 as described herein may include contacts (not shown) as known in the art of semiconductor manufacturing.

Figure 7:
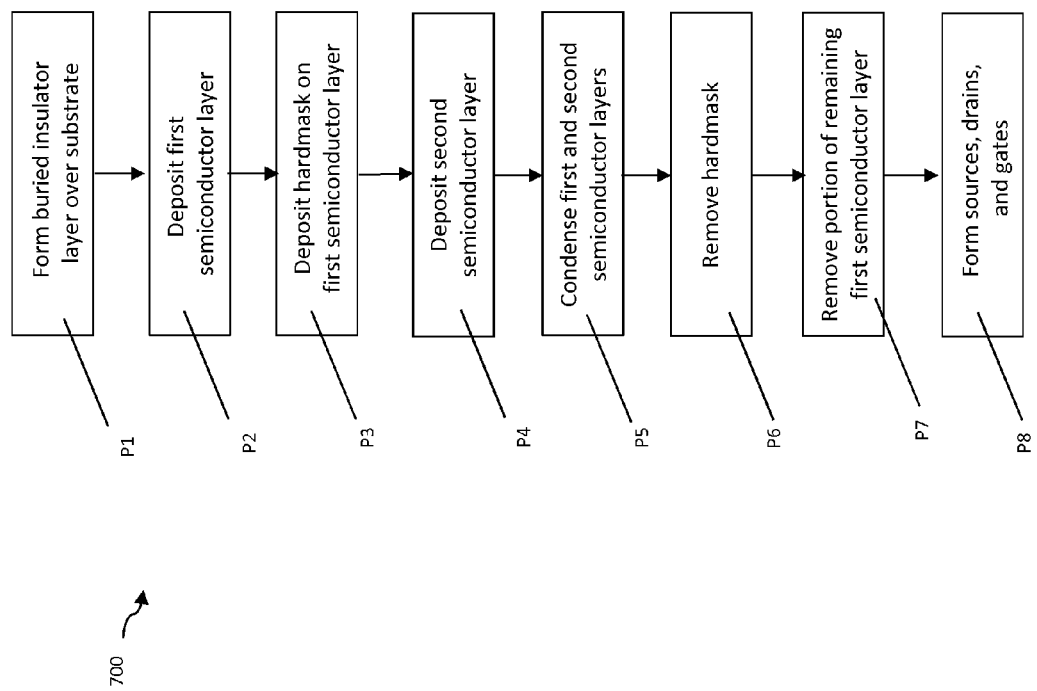
FIG. 7 shows a flow diagram of a method for fabricating the semiconductor device.

Referring now to FIG. 7 which shows a method 700 for fabricating embodiments of the semiconductor devices (i.e., 10 (FIGS. 1, 2), 100 (FIGS. 3, 4), 200 (FIGS. 5, 6)) described herein. In process P1, a buried insulator layer may be formed over a substrate using any now known or later developed deposition technique, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. It is to be understood that the use of the term "depositing" or "deposited" herein may include any of the above deposition techniques. Buried insulator layer and substrate may include any of the materials previously described with reference to buried insulator layers and substrates of the previous embodiments, respectively.

In process P2, a first semiconductor layer having a first bandgap may be deposited on the buried insulator layer. A hardmask may be deposited on the first semiconductor layer in process P3. The hardmask may be deposited to define one or more long channel regions and one or more short channel regions such that at least one long channel region is adjacent to at least one short channel region. In process P4, a second semiconductor layer having a second bandgap may be epitaxially deposited over the first semiconductor layer in the at least one long channel region and the at least one short channel region. The second bandgap may be smaller than the first bandgap. The first material may be silicon and the second material may be germanium or silicon-germanium.

In process P5, the first and second semiconductor layers may be combined to create a third semiconductor layer. First and second semiconductor layers are combined through condensation in an oxidizing ambient or by applying heat to first and second semiconductor layers. The hardmask can be removed to expose the first semiconductor layer remaining underneath the hardmask in process P6. The hardmask may be removed by known processes in the field of semiconductor manufacturing such as etching. Etching may include any now known or later developed techniques appropriate for the material to be etched including but not limited to, for example: isotropic etching, anisotropic etching, plasma etching, sputter etching, ion beam etching, reactive-ion beam etching and reactive-ion etching (RIE). The placement and removal of the hardmask allows for self-aligned epitaxial replacement of the end of the channel adjacent to the source and drain as will be discussed.

In process P7, a portion of the remaining first semiconductor layer between the at least one long channel region and the at least one channel region is removed to substantially separate the at least one long channel region from the at least one short channel region. First semiconductor layer may be removed by example etching processes as discussed herein with respect to process P5. During this removal process, a portion of first semiconductor layer remains adjacent to a first side of the third semiconductor layer in the long channel region (as shown in channel region 20 of FIG. 1). That is, the at least one long channel region may include a first region which may be defined by the remaining first semiconductor layer. The at least one long channel region may also include a second region which may be defined by the third semiconductor layer. The bandgap of the material(s) in the first region may be greater than a bandgap of the material(s) in the second region. In another embodiment, the portion of the first semiconductor layer remains adjacent to a first and a second side of the third semiconductor layer in long channel region (shown in channel region 20 of FIG. 2). That is, the first region of the at least one long channel region may include a first subregion and a second subregion that are substantially separated by the second region.

In the embodiment described with reference to FIGS. 5-6, the first semiconductor layer may be removed in process P7 such that a PFET and a NFET region are formed. That is, the first semiconductor layer may be removed to define a first region in the first long channel region (to create a bifurcated bandgap) and a first short channel region in the PFET region. Additionally, the first semiconductor layer may be removed to define a second long channel region and a second short channel region in the NFET region. As discussed previously relative to FIGS. 5-6, the long channel region with a bifurcated bandgap may be in either the PFET region or the NFET region, or both of the PFET or NFET regions. That is, the removal of the hardmask and the first semiconductor layer may be performed to customize the location of the portion of the semiconductor device having the bifurcated bandgap.

In process P8, sources, drains, and gates may be formed. Sources are formed on buried insulator layer. The sources may be formed such that at least one source is adjacent to a first side of each of the at least one long channel regions and the at least one short channel regions. Drains may also be formed on the buried insulator layer. At least one drain may be formed adjacent to a second side of each of the at least one long channel regions and the at least one short channel regions. The sources and/or drains may be formed such that each source and drain is substantially separated by the corresponding channel region. Where the at least one long channel region includes a first region and a second region, the drain may be formed adjacent to the first region and the source may be formed adjacent to the second region. Where the at least one long channel region includes a first subregion and a second subregion, the drain may be formed adjacent to the first subregion and source may be formed adjacent to the second subregion. As previously discussed, the first subregion and the second subregion may have lengths substantially equal to band tunneling of the source and the drain respectively. The gate is formed on each of the at least one long channel regions and the at least one short channel regions. The forming of the gate may also may further include depositing a first insulator layer on the at least one long channel region prior to forming the gate on the at least one long channel region and depositing a second insulator on the at least one short channel region prior to forming the gate on the at least one short channel region. The first and second insulator layers may be deposited such that first insulator layer may be thicker than the second insulator layer. Additionally, method 700 may also include depositing an interlevel dielectric layer over channels, sources, drains, and gates on buried insulator layer.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments, the practical application or technical improvement over technologies found in the marketplace, or to enable others of ordinary skill in the art to understand the embodiments disclosed herein.

We claim:

1. A semiconductor device comprising:
   an interlevel dielectric layer on a buried insulator layer over a semiconductor substrate;
   a source and a drain in the interlevel dielectric layer;
   a channel between the source and drain, the channel including a first region having a first bandgap adjacent to a second region having a second bandgap, wherein the first bandgap is larger than the second bandgap; and
   a gate over the channel,
   wherein the first region further includes a first subregion and a second subregion, the first subregion being adjacent to the source and the second subregion being adjacent to the drain, and
   wherein the second region substantially separates the first subregion and the second subregion.

2. The semiconductor device of claim 1, wherein the first subregion extends away from the source a distance substantially equal to a distance of band tunneling of the source, and
   wherein the second subregion extends away from the drain a distance substantially equal to a distance of band tunneling of the drain.

3. The semiconductor device of claim 1, wherein the first region is adjacent to the drain such that the first region substantially separates the second region and the drain, and wherein the second region is adjacent to the source such that the second region substantially separates the first region and the source.

4. The semiconductor device of claim 1, wherein the first region includes silicon and the second region includes strained silicon germanium.

5. The semiconductor device of claim 1, wherein the channel includes a semiconductor fin and the gate substantially surrounds at least a portion of the semiconductor fin.

6. A semiconductor device with a bifurcated bandgap, the semiconductor device comprising:
   a plurality of semiconductor structures including at least one long channel semiconductor structure and at least one short channel semiconductor structure;
   wherein the at least one long channel semiconductor structure includes:
      a first source and a first drain in an interlevel dielectric layer,
      a long channel region between the first source and the first drain, the long channel region including a first region having a first bandgap and a second region having a second bandgap, wherein the first band gap is larger than the second band gap, and
      a first gate on the long channel region; and
   wherein the at least one short channel semiconductor structure includes:
      a second source and a second drain in the interlevel dielectric layer,
      a short channel region between the second source and the second drain;
   wherein the first bandgap and the second badgap bifurcate the bandgap of semiconductor device.

7. The semiconductor device of claim 6, wherein the first region of the at least one long channel semiconductor structure further comprises:
   a first subregion and a second subregion,
   wherein the first subregion is adjacent to the first source and wherein the second subregion is adjacent to the first drain, and
   wherein the second region substantially separates the first subregion and the second subregion.

8. The semiconductor device of claim 7, wherein the first subregion extends away from the first source a distance substantially equal to a distance of band tunneling of the first source, and
   wherein the second subregion extends away from the first drain a distance substantially equal to a distance of band tunneling of the first drain.

9. The semiconductor device of claim 6, wherein the first region is adjacent to the first drain such that the first region substantially separates the second region and the first drain; and wherein the second region is adjacent to the source such that the second region substantially separates the first region and the source.

10. The semiconductor device of claim 6, wherein the first region includes silicon and the second region includes strained silicon germanium.

11. The semiconductor device of claim 6, wherein the short channel region has a bandgap substantially equal to the second bandgap.

12. The semiconductor device of claim 6, wherein the short channel semiconductor structure and the long channel semiconductor structure are separated from one another.

13. The semiconductor device of claim 6, further comprising:
- a first insulator layer over the long channel region and under the first gate; and
- a second insulator layer over the short channel region and under the second gate,
- wherein the first insulator layer is thicker than the second insulator layer.

14. The semiconductor device of claim 6, further comprising:
- a p-type field effect transistor (PFET) region and a n-type field effect transistor (NFET) region,
- wherein the PFET region and the NFET region are adjacent to one another in the interlevel dielectric layer,
- wherein the at least one long channel semiconductor structure includes a first long channel semiconductor structure having a first long channel region, the long channel region having a first region of a larger bandgap and a second region of a smaller bandgap,
- wherein the at least one short channel semiconductor structure includes a first short channel semiconductor structure, and
- wherein the first long channel semiconductor structure and the first short channel semiconductor structure are in the PFET region.

15. The semiconductor device of claim 6, wherein the at least one long channel region includes a first semiconductor fin and the first gate substantially surrounds the first semiconductor fin, and
- wherein the at least one short channel region includes a second semiconductor fin and the second gate substantially surrounds the second semiconductor fin.

16. The semiconductor device of claim 1, wherein the second region includes strained silicon germanium.

17. The semiconductor device of claim 1, wherein the semiconductor device is a planar device.

18. The semiconductor device of claim 1, wherein the first region includes gallium and the second region includes indium gallium arsenide.

19. The semiconductor device of claim 6, wherein the first region includes gallium and the second region includes indium gallium arsenide.

* * * * *